United States Patent [19]

Richardson

[11] Patent Number: 5,148,434
[45] Date of Patent: Sep. 15, 1992

[54] DIGITAL DATA GENERATOR

[75] Inventor: Mark W. Richardson, Saint-Victor sur Loire, France

[73] Assignee: Schlumberger Industries, S.A., Paris, France

[21] Appl. No.: 519,883

[22] Filed: May 7, 1990

[30] Foreign Application Priority Data

May 10, 1989 [FR] France .................................. 89 06130

[51] Int. Cl.⁵ .......................... H04J 3/14; G06F 11/22; G06F 11/26
[52] U.S. Cl. ..................................... 371/20.1; 371/27; 370/99
[58] Field of Search ......................... 371/47.1, 27, 20.1; 370/99, 82, 79, 105

[56] References Cited

U.S. PATENT DOCUMENTS

| | | | |
|---|---|---|---|
| 4,658,152 | 4/1987 | Walters | 370/99 |
| 4,752,923 | 6/1988 | Allen et al. | 370/99 |

FOREIGN PATENT DOCUMENTS 2721764 10/1970 Fed. Rep. of Germany .

*Primary Examiner*—Jerry Smith
*Assistant Examiner*—Henry C. Lebowitz
*Attorney, Agent, or Firm*—Frishauf, Holtz, Goodman & Woodward

[57] ABSTRACT

The invention relates to data generators producing output signals representative of data and in compliance with a predetermined telecommunications standard. A generator of the invention comprises a memory device programmed with data which produces signals representing control bits for controlling the configuration of output data, e.g. frame and multiframe synchronization signals, and additional signals which control a sequence generator producing a sequence of data to be inserted in the data pattern. Operation is completely programmable and may be adapted to numerous different telecommunications standards. The invention is applicable to testing telecommunications networks.

10 Claims, 4 Drawing Sheets

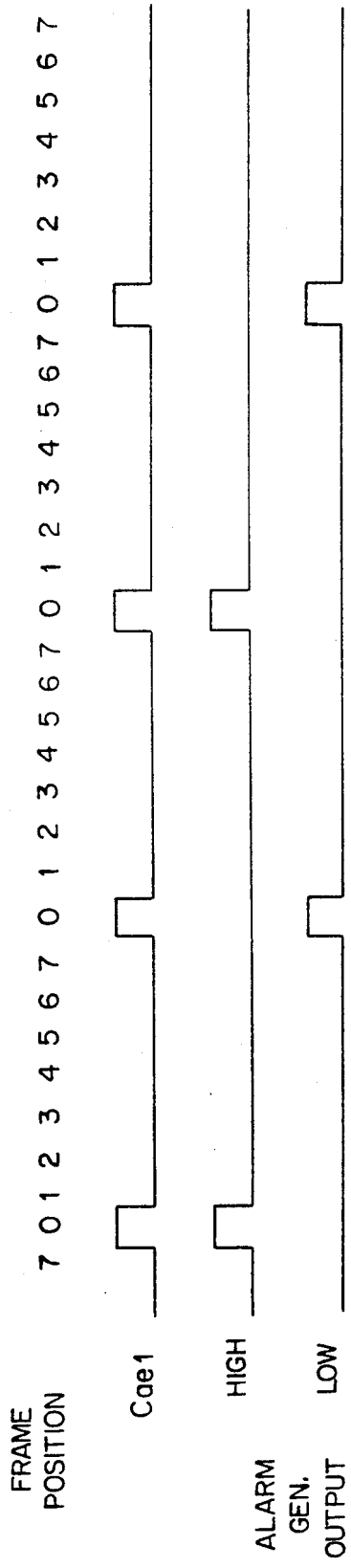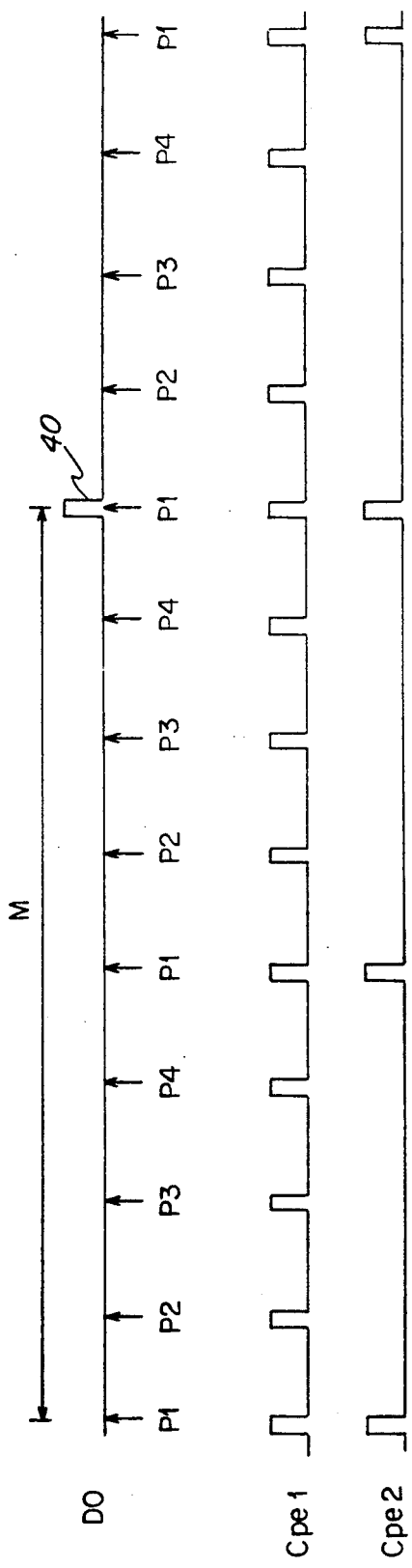

DIGITAL DATA GENERATOR

The present invention relates to a digital data generator, it relates more particularly to a generator which produces serial data in a format that complies with a telecommunications standard.

BACKGROUND OF THE INVENTION

There are numerous telecommunications standards in use, such as CCITT standards V24, V35, G704, and X50, for example. All of these standards seek to synchronize a serial data stream in such a manner as to enable data words to be identified correctly, each word being constituted by a predetermined number of individual data bits. The digital data word to be transmitted (known in the art as a sequence or pattern) is synchronized bit by bit with a clock defining the data transmission rate, in order to form a data stream. In a typical transmission standard, the data sequence is surrounded by synchronization bits which are used by the telecommunications channel to ensure correct reception and routing of data. In a simple standard, the data stream includes a prefix constituted by a predetermined code (the "start" bits) and it is followed by a second predetermined code (the "stop" bits). Data may be received after the start bits have been detected, and detection of the stop bits guarantees that synchronization has not been lost and that the sequence has been validly received. The data stream constituted by the sequence and the synchronization bits is called a "frame". In many standards, frames are themselves grouped into multiframes each containing a predetermined number of frames, with each multiframe having its own synchronization bits. This improves synchronization and enables data coming from a plurality of different sources to be multiplexed in a single multiframe. For example, a sequence from each source may be transmitted in the same frame position within each multiframe. Typically a standard specifies the number of sequence bits, the number and position of synchronization bits (for example the number of start bits and the number of stop bits), the number of frames per multiframe, and the number and position of multiframe synchronization bits. A standard will also specify the characteristics of the waveform which constitutes the data stream, for example voltage levels for high and low bits, and waveform rise times at bit transitions.

Telecommunications networks need to be tested in order to verify that communication is taking place in compliance with a selected standard, and that this standard enables transmission to take place with a reasonably low error rate. In order to perform such testing, a data generator is used for injecting data into the network. At the receiving end measurements are made to establish various parameters about the network, and tests may be performed, for example, to answer the following questions:

i) are the waveforms appearing at the receiving end acceptable according to the standard;

ii) can receiving equipment operating in compliance with the standard be synchronized correctly; and iii) can data be received reliably?

A test of type (i) above could be a relatively simple test, performed with a measuring instrument, for example an ancilloscope. Some receiving equipment (including at least the synchronizing circuits) is required to perform a test of type (ii) above, whereas an entire receiver capable of decoding and comparing or recording data is required for a type (iii) test.

All of these types of tests share the requirement for a data generator capable of producing a representative data stream in compliance with the standard in use. Conventional data generators comprise a sequence generator having a clock input such that a data bit is output at each clock transition for example, together with some control hardware to extract a sequence at the required time and to add synchronization bits to the pulse train. Sequence generators are well known in the art and, for example, they may produce sequence data by means of a predetermined algorithm or function (e.g. a polynomial function) so that it is possible to determined whether reception is error-free, or they may produce a random signal in order to enable statistical characteristics about a transmission network to be established.

It is desirable for a data generator to be capable of operating in compliance with more than one standard, since such equipment is typically portable for field testing and there are many different network standards to be tested. When there are data rate differences between networks to be tested, merely changing the clock rate may suffice, but when different standards are concerned, then different control hardware is necessary. Data generators are typically fitted with switches for switching the control hardware (e.g. timers, gates, and counters) so as to control the sequence generator in compliance with the selected standard, or such generators are of modular design enabling cards to be inserted including control hardware appropriate for the standard under consideration.

Data generators designed in this way suffer from various drawbacks. Networks can be tested only when they implement standards for which control hardware is available. It may be difficult to adapt an existing generator to a newly-specified standard, and at best there will be a delay before a user can obtain new control hardware. Such generators are not easily adapted to tests performed on multiple standards, and this type of test is impossible with modular generators.

SUMMARY OF THE INVENTION

According to the invention, a data generator comprises:

a memory device addressed incrementally from a predetermined value under the control of a clock;

the memory device containing data words;

each bit of each data word representing a state of a control signal during a frame;

logic means for combining the control signals so as to obtain an additional control signal for a sequence generator, and also for combining said signals with the output signal from the sequence generator in order to provide a data stream; and at least one of the said control signals being representative of frame length and being designed to recommence addressing the device from the predetermined value.

It is preferable for others of the above-specified control signals to be representative of sequence length, of multiframe length, of frame synchronization bits, and of multiframe synchronization bits.

The output data is advantageously stored in bistable latches and means are advantageously provided for writing to the memory device during a clock interval. In this way, the characteristics of the data produced can be changed while continuous operation of the generator is maintained.

BRIEF DESCRIPTION OF THE DRAWINGS

Embodiments of the invention are described by way of example with reference to the accompanying drawings, in which:

FIGS. 4 and 5 are waveform timing diagrams associated with the embodiment of FIG. 3.

DETAILED DESCRIPTION

Figure 1:
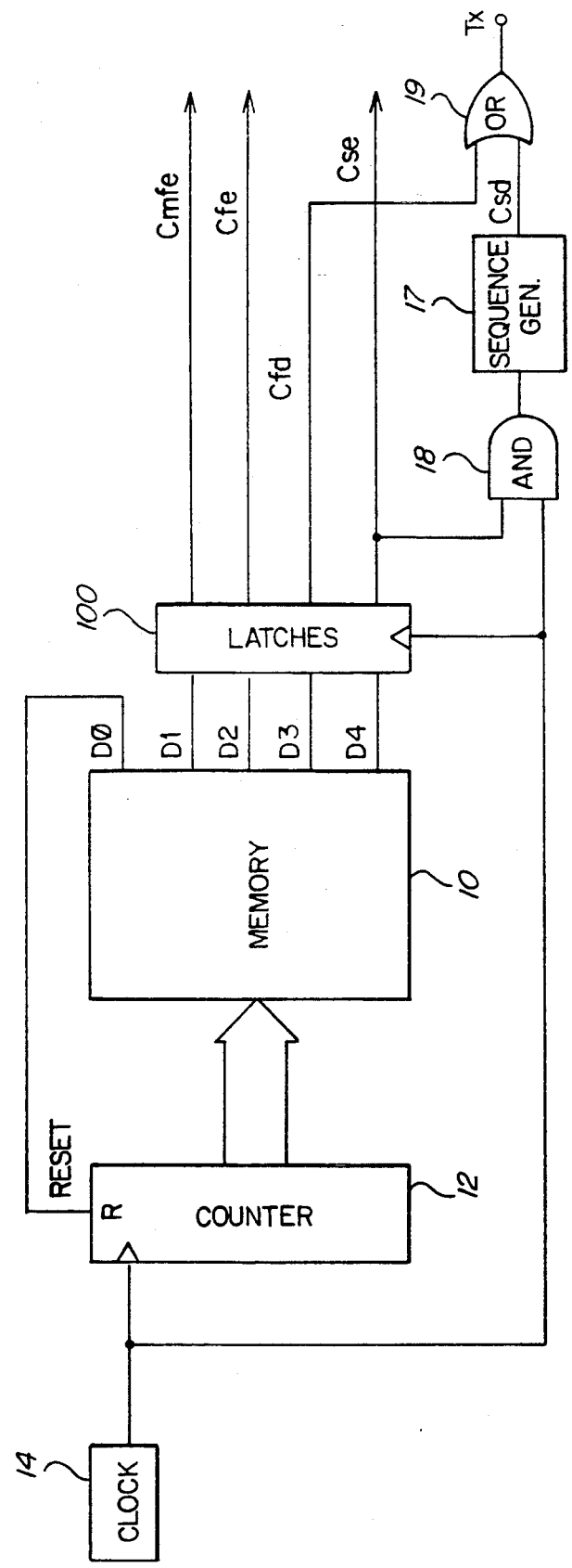
FIG. 1 is a block diagram of a data generator of the invention.

In a data generator (FIG. 1), a memory device 10 has address inputs 11 and a set of data outputs (D0–D4). The data inputs are connected to the outputs of a counter 12 whose clock input is clocked by a base clock 14. The memory 10 is thus addressed incrementally on the basis of the clock period starting from a predetermined value which may be loaded into the counter, e.g. from zero when the counter 12 is reset to zero. The reset input of the counter 12 is driven by the output D0 of the memory 10 such that each time the data loaded into bit D0 of the memory 10 at the address defined by the counter 12 is in the high state, then the counter 12 is reset and incremental addressing of the memory 10 recommences from zero.

The bit D0 of the memory 10 provides a control signal representative of frame length or of multiframe length, and the memory 10 is programmed to contain a high value at the address whose value represents the total number of base clock cycles required by the desired frame (or multiframe) structure. For example, for a multiframe structure occupying 16 bits, D0 is programmed to have a high state at address 15 (the sixteenth position) so as to reset the counter to zero once every 16 clock periods. Within this cyclic regime, other data bits of the memory 10 are programmed so as to represent other control signals as required by the frame structure. Except for bit D0, the data bits are latched in a set of latches 100 by the clock 14.

Bit D1 provides a multiframe synchronization pulse signal Cmfe, while bit D2 provides a frame synchronization frame signal Cfe. Data for multiframe and frame synchronization is provided in bit D3.

Bit D4 provides a signal Cse which takes up the high state to enable a sequence generator 17, and each pulse received by the sequence generator provides one bit of a word in the sequence, when a clock pulse is received. The sequence generator 17 is designed to receive clock pulses via an AND gate 18, thereby producing the sequence data signal Csd whenever enabled by the signal Cse. Finally, the data signals are combined by an OR gate 19 in order to produce a transmission signal Tx in compliance with the required transmission standard.

The operation of the embodiment of FIG. 1 and the programming of its memory is now considered in greater detail.

By way of example, consider a transmission standard which is specified by an 8-bit frame in which the first bit is a frame synchronization bit, the following 6 bits are reserved for receiving a sequence, and the last bit is provided for multiframe synchronization, where a multiframe contains two frames. For frame synchronization, the synchronization bits are always at the low level, whereas for multiframe synchronization, the first frame of the multiframe has a high level synchronization bit and the second frame has a low level bit. In order to provide data in compliance with the above norm, the memory 10 is programmed as follows:

| Address | D0 | Cmfe D1 | Cfe D2 | Cfd D3 | Cse D4 |
|---|---|---|---|---|---|
| 0 | 0 | 0 | 1 | 0 | 0 |
| 1 | 0 | 0 | 0 | 0 | 1 |
| 2 | 0 | 0 | 0 | 0 | 1 |
| 3 | 0 | 0 | 0 | 0 | 1 |
| 4 | 0 | 0 | 0 | 0 | 1 |
| 5 | 0 | 0 | 0 | 0 | 1 |
| 6 | 0 | 0 | 0 | 0 | 1 |
| 7 | 0 | 1 | 0 | 0 | 0 |
| 8 | 0 | 0 | 1 | 0 | 0 |
| 9 | 0 | 0 | 0 | 0 | 1 |
| 10 | 0 | 0 | 0 | 0 | 1 |
| 11 | 0 | 0 | 0 | 0 | 1 |
| 12 | 0 | 0 | 0 | 0 | 1 |
| 13 | 0 | 0 | 0 | 0 | 1 |
| 14 | 0 | 0 | 0 | 0 | 1 |
| 15 | 1 | 1 | 0 | 1 | 0 |

Figure 2:
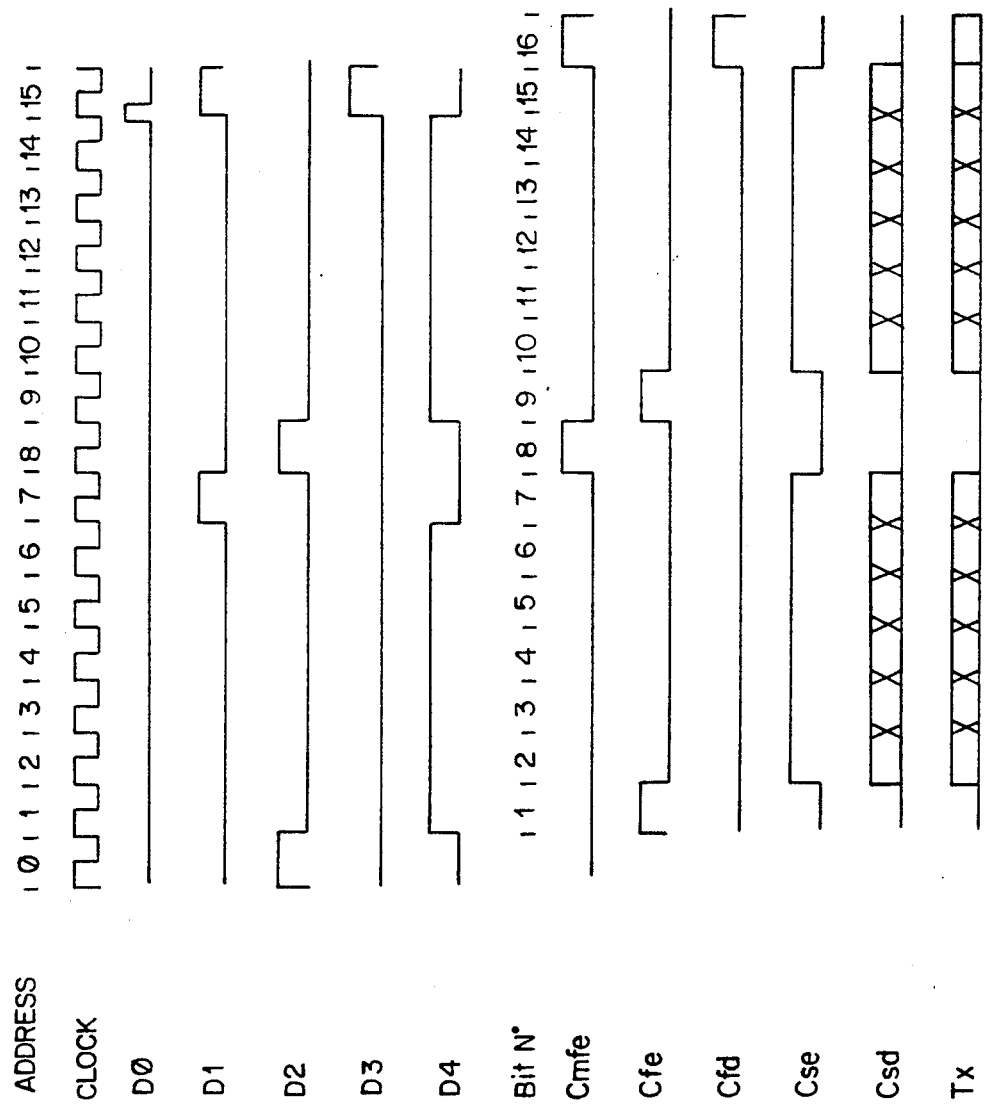
FIG. 2 is a waveform timing diagram for the embodiment of FIG. 1.

FIG. 2 is a timing diagram relating to the operation of the FIG. 1 embodiment with its memory programmed in the manner shown above. The timing diagram shows that bit 1 of the resulting signal Tx contains the frame synchronization bit (0), bits 2 to 7 contain an inserted sequence word, and bit 8 contains a multiframe sychronization bit (0). Bit 9 contains the frame sychronization bit (0) for the second frame, bits 10 to 15 contain a sequence word, and bit 16 contains a multiframe sychronization bit (1). When the counter reaches 15, the high value of D0 causes a reset to zero pulse to appear, thereby causing addressing to recommence so that bit 16 is followed cyclically by bit 1, and so on. A data signal is thus obtained in compliance with the specified transmission standard.

If it is necessary to obtain a data signal produced in compliance with a different transmission standard, then the memory can be reprogrammed. For example, if the frame sychronization bits should be high level bits, then the memory can be programmed with high level bits in D3 at addresses 0 and 8. For more complex multiframe structures, a sychronization code is specified rather than the single bits of the simple example above. This may be achieved directly by programming the appropriate sychronization pulse (Cmfe or Cfe) so that it is at the high level over the entire length of the code and by programming the code itself in appropriate data positions (Cfd). In the above example, if frame sychronization were to be extended from one bit to three bits, bit D2 in positions 0, 1, and 2 would be programmed to high level, and bit D3 would be programmed with the code in the same positions. The manner in which the other positions would need to be reprogrammed and the shifting of the high level in D0 from address 15 to address 19 are apparent to the person skilled in the art. Other codes, e.g. multiframe header codes, may be inserted in the signal Cfd. The signals Cfe, Cmfe, Cse, and any other enabling signals are provided as output signals to enable an interface to be made with other equipment, e.g. a disturbance generator. These signals constitute clock signals of controlling an equipment capable of responding directly to sychronization pulses and to sequence enable signals.

Figure 3:
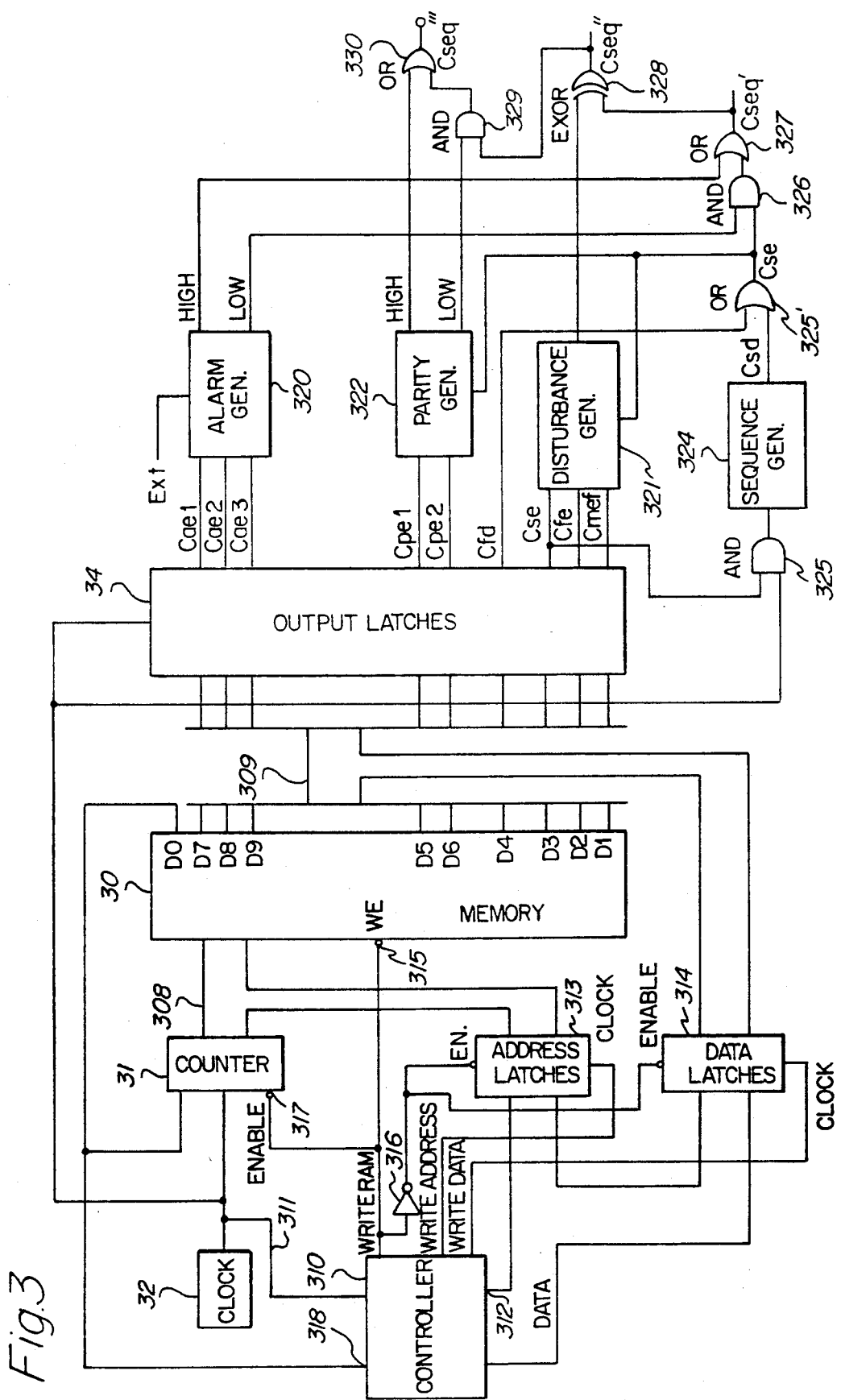
FIG. 3 is a block diagram of another embodiment of the invention.

In an additional embodiment of the invention (FIG. 3), a memory device 30 is addressed incrementally by a counter 31 driven by a clock 32. The counter is reset to zero by data bit zero of the memory 30 in order to obtain cyclic incremental addressing. Output bits D1 to D9 are applied to a set of latches 34 with the clock input thereto being driven by the output from the base clock 32. The set of latches 34 is designed to load on a positive going edge of clock 32 so that the output signals from the set of latches are stable throughout each clock period. The output bits from the memory device 30 represent control signals which are data signals or enable signals.

In a manner analogous to that described with reference to the embodiment of FIG. 1, the signal Cse controls the application of clock pulses to a sequence generator 324 via an AND gate 325. The output signal Csd from the sequence generator is combined with the programmed frame sychronization data signal Cfd so as to obtain the desired binary pattern signal Cseq.

In the above-described embodiment, the data bit output signals which constitute the control signals are designated as follows:

| D0 | reset counter | |
|----|---|---|
| D1 | multiframe sychronization enable | Cmfe |
| D2 | frame sychronization enable | Cfe |
| D3 | frame sychronization data | Cfd |
| D4 | sequence generator enable | Cse |
| D5 | parity generator enable | CPe1 |
| D6 | parity generator stop | CPe2 |
| D7 | alarm generator enable | Cae1 |
| D8 | alarm generator control | Cae2 |
| D9 | alarm generator control | Cae3 |

It may be observed that with this structure is it possible to produce signals in compliance with any telecommunications standard, including forcing start, stop, and parity bits to certain values, if so desired.

It may be observed that the embodiment of the invention described above is programmable to comply with any standard which exists and with virtually any standard that might be devised. In particular, this embodiment directly provides signals controlling an alarm generator 320, a disturbance generator 321, and a parity generator 322.

The alarm generator 320 may be controlled by the three control/enable signals Cae1, Cae2, and Cae3 which are produced therefor. In accordance with common practice, the control signals comprise a timing signal (Cae1), i.e. a signal which marks the place in the sequence where data is to be inserted, and set high and set low signals (Cae2 and Cae3 respectively) which produce a pulse whenever data is to be high or low, respectively. In addition, the alarm generator 320 responds to an external input signal EXT which specifies whether the bits are to be inserted or not. It may be observed that the alarm generator can be used to insert bits at any point in the binary pattern, as may be required. Inserted bits or alarms are typically used for triggering events in the receiving or monitoring equipment. Alarms may consist in a single bit (at high level or at low level) at a designated position in the frame, in a repetitive pattern within the frame, or in a pattern which is set bit by bit in designated positions over a plurality of frames.

For example, in an 8-bit frame in which bit zero is reserved for alarm purposes, an alarm could be defined by the sequence 1010. In order to insert such an alarm, bit D7 (Cae1) would be programmed to produce the signal shown in FIG. 4. The alarm generator produces an output signal HIGH (set high bit) and an output signal LOW (set low bit) which are combined with the binary pattern signal Cseq by an OR gate 327 and an AND gate 326 so as to produce the desired binary pattern signal (Cseq'). Typically, an alarm may be a predetermined sequence inserted one bit at a time over 15 multiframes. The other bits, D8, Cae2, and D9, Cae3 are used for producing other alarms.

The disturbance generator 321 which may be configured as known in the art, is used to inject errors into the signal which is produced by inverting the state of a bit or by maintaining a bit in the LOW state (in order to simulate signal loss). Such a generator is typically capable of producing "n" consecutive errors every "m" bits, with $1 \leq n \leq 250$ and $n \leq m \leq 1 \times 10^7$. In addition to receiving the data signal Cseq, the generator receives the multiframe, the frame, and the sequence sychronization signals Cmfe, Cfe, and Cse, thereby making it possible to produce errors solely in the frame bits, or in the multiframe bits, if so desired. It has an output which controls one of the inputs of an EXCLUSIVE-OR gate 328 whose other input receives the non-disturbed binary sequence as generated Cseq', with the gate 328 thus providing the disturbed sequence signal Cseq".

The parity generator 322 serves to produce a four-bit checksum (for example) during each half multiframe, and then to insert these four bits in appropriate predetermined positions in the following half multiframe. In a telecommunications link, a similar generator would be present at the receiving end and the checksums would be compared after extracting the appropriate bits. In order to control this known form of parity generator, the memory 30 is programmed on bits D5 and D6 so as to produce control signals Cpe1 and Cpe2 indicating the bit positions at the end of respective ones of the half multiframes. For example, for a multiframe of length M (FIG. 5) as marked by a reset pulse 40 provided by memory data bit D0, the positions of the corresponding checksum bits could be P1, P2, P3, and P4. Bit D5 (Cpe1) is then programmed so as to produce a pulse at each of these bit positions, while bit D6 (Cpe2) is programmed to mark the beginning of each sequence of bit positions. In addition, the generator 321 receives the non-disturbed binary sequence signal Cseq so as to be able to form the checksum. The parity generator 321 delivers a pulse on its LOW output each time that a parity bit is to be inserted at low level, and it provides a pulse on its HIGH output each time a parity bit is to be inserted at high level. The signals from the HIGH and LOW outputs are combined with the binary pattern signal (Cseq') by OR gate 330 and AND gate 329 in order to provide the desired binary pattern signal Tx (Cseq''').

It may be observed in addition that the embodiment may easily be programmed on the basis of the length of any arbitrary component of the data stream and its content. To enable control of an external sequence generator, the signals Cmf (multiframe synchronization), Cf (frame synchronization), Ct (start code), Cp (stop code), P (parity code), Mf (multiframe header), H (frame header), and Cseq (sequence generator clock) are applied to respective corresponding outputs.

Although the system may be programmed by fixing data in a read only memory (ROM) constituting the device 30, and the system may be reprogrammed by exchanging ROMs, the stability of the data means that the memory address bus 308 and the data bus 309 are free during the clock period. It is therefore possible to use a read/write memory (RAM) for the memory device 30 and it may be programmed and reprogrammed during the clock periods.

To this end, a controller is used for taking charge of the data buses 308 and 309 each time a reprogramming operation is to be performed. Controller operation is synchronized on the base clock by line 311. In order to reprogram, data defining the new standard to be followed is initially assembled in a memory of the controller in the form of a table of data as a function of address, i.e. in a form analogous to the data table described above by way of example. When the data at a given address is different from the data presently at that address in the RAM 30, the data bus outputs 312 of the controller are set to values corresponding to the address to be changed. This address is latched in a set of address latches 313 under the effect of a clock signal (address write) which the controller 310 applies to the clock input of the set of address latches. The data bus outputs 312 of the controller are then set to values corresponding to the data required in the RAM 30 at the address which has just been latched in the set of address latches 313. The data is latched in similar manner in a set of data latches 314 by a "write data" signal. Once the data has been latched, the controller 310 applies a write RAM signal to input WE (write enable) 315 of the RAM 30. Under the effect of this signal, the data present in the set of data latches 314 is loaded into the RAM 30 at the address latched in the set of address latches 313. It may be observed that any other address containing data that does not match the newly-required standard may be changed in similar manner in order to reprogram the RAM 30 to comply with the new standard.

To complete the description of the present embodiment, it may be observed that during normal operation, the write RAM signal holds the clock output data in the active state on the address bus 308 via its enable input 317, and similarly inhibits data in the set of address latches 313 via an inverter 316. The outputs of the set of data latches 314 are isolated in similar manner from the data bus 309 to enable the RAM 30 to control the bus. Conversely, during reprogramming, the memory 30 is inhibited by the signal present on its input WE.

The controller 310 receives the clock signal 311 to ensure that reprogramming does not take place during a clock transition instant. If so desired, reprogramming may be synchronized on multiframe reset by taking account of the signal at controller input 318.

The controller 310 may include a user interface itself programmed to collect user instructions and to provide the required control signals as described above. The controller may be constituted by a microcomputer system and the person skilled in the art will readily be able to perform the programming and interface functions required by the system.

Naturally the generator described and shown may be modified in numerous ways without going beyond the scope of the invention.

I claim:

1. A digital data generator for producing an output data stream in accordance with a frame format in accordance with a telecommunications standard, wherein the generator comprises:

addressable memory means for recording data words, each address of said memory means being representative of a bit position in a frame, each bit of each data word representing the state of a corresponding signal of a plurality of control signals at the position in the frame associated with the address of the data word;

addressing means for addressing the memory device incrementally from a predetermined value in response to a clock;

at least one of the control signals being representative of frame length and being applied to the addressing means in order to cause addressing of the memory device to recommence from the predetermined value;

a sequence generator for producing a sequence data signal in response to at least one control signal; and logic means for combining the sequence data signal with at least one control signal to provide the output data stream.

2. A digital data generator according to claim 1, wherein the control signals further include signals representative of sequence length, of multiframe length, of frame synchronization bits, and of multiframe synchronization bits.

3. A digital data generator according to claim 1, further including latch means connected to the memory device and controlled by the clock for latching the data read from the memory device during each clock interval.

4. A digital data generator according to claim 3, further including programming means for writing data into the memory device during a clock interval, thereby enabling said data words to be changed in order to modify the characteristics of the output data stream while maintaining continuous operation of the sequence generator.

5. A digital data generator according to claim 1, further including a disturbance generator for injecting errors into the output data stream.

6. A digital data generator according to claim 5, wherein the disturbance generator receives control signals representative of frame synchronization and of sequence synchronization, together with the sequence data signal, thereby enabling it to be inject errors at selected positions in a frame when producing a disturbed output data stream.

7. A digital data generator according to claim 1, further including a parity generator which receives the sequence data signal for generating parity bits to be inserted in the output data stream.

8. A digital data generator according to claim 7, wherein the memory device stores data words representative of the states of control signals representative of the bit positions at which the parity bits are to be inserted into the output data stream, and which are applied to the parity generator.

9. A digital data generator according to claim 1, further including an alarm generator for inserting alarm bits in the output data stream.

10. A digital data generator according to claim 9, wherein the memory device stores data words representative of the states of control signals which are representative of the bit positions in which alarm bits are to be inserted in the output data stream, and representative of the values of the alarm bits, which signals are applied to the alarm generator.

* * * * *